United States Patent
Ali et al.

(10) Patent No.: US 8,698,766 B2
(45) Date of Patent: Apr. 15, 2014

(54) SYSTEM INTEGRATION OF TACTILE FEEDBACK AND TOUCHSCREEN CONTROLLER FOR NEAR-ZERO LATENCY HAPTICS PLAYOUT

(75) Inventors: Yassir Ali, Sunnyvale, CA (US); Bart DeCanne, Sunnyvale, CA (US); Timothy Lance Blankenship, Austin, TX (US); Paul Nickson, Newtown (GB); Lee Coleman, Kintbury (GB)

(73) Assignee: Maxim Integrated Products, Inc., San Jose, CA (US)

( * ) Notice: Subject to any disclaimer, the term of this patent is extended or adjusted under 35 U.S.C. 154(b) by 524 days.

(21) Appl. No.: 12/986,991

(22) Filed: Jan. 7, 2011

(65) Prior Publication Data

US 2011/0260990 A1  Oct. 27, 2011

(51) Int. Cl.
*G06F 3/041* (2006.01)

(52) U.S. Cl.
USPC .......................... 345/173; 715/701

(58) Field of Classification Search
USPC .................. 345/156–175; 715/701–702; 178/18.01–20.01
See application file for complete search history.

(56) References Cited

U.S. PATENT DOCUMENTS

| | | | |
|---|---|---|---|
| 4,527,096 A | 7/1985 | Kindlmann | |
| 5,313,141 A | 5/1994 | Kimball | |
| 5,463,283 A | 10/1995 | Sanderson | |
| 5,789,870 A | 8/1998 | Remson | |
| 6,466,036 B1 | 10/2002 | Philipp | |
| 6,937,124 B1 | 8/2005 | Nakamura et al. | |
| 7,061,327 B2 | 6/2006 | Doy | |
| 7,176,753 B2 | 2/2007 | Noda et al. | |
| 7,283,120 B2 | 10/2007 | Grant | |
| 7,667,371 B2 | 2/2010 | Sadler et al. | |
| 2002/0149561 A1* | 10/2002 | Fukumoto et al. | 345/156 |
| 2003/0067449 A1* | 4/2003 | Yoshikawa et al. | 345/173 |
| 2003/0174121 A1 | 9/2003 | Poupyrev et al. | |
| 2006/0119586 A1 | 6/2006 | Grant et al. | |
| 2007/0080951 A1* | 4/2007 | Maruyama et al. | 345/173 |
| 2008/0055277 A1* | 3/2008 | Takenaka et al. | 345/177 |

(Continued)

FOREIGN PATENT DOCUMENTS

WO   9743825   11/2007

OTHER PUBLICATIONS

International Search Report dated Dec. 3, 2009, PCT Patent Application Serial No. PCT/US 09/61359, Filed Oct. 20, 2009, Maxim Integrated Products, Inc.

(Continued)

*Primary Examiner* — Hong Zhou
(74) *Attorney, Agent, or Firm* — Advent, LLP (57) ABSTRACT

A haptic feedback system includes a user interface device, such as a touchscreen that includes a touch panel and one or more haptic drive elements coupled to the touch panel, a touch controller, and an actuator controller. The touch controller receives sensed data from the touch panel, and in response generates and sends a haptic signal to an actuator controller. Generation and transmission of the haptic signal bypasses any system host controller. A dedicated signal path couples the touch controller and the actuator controller, over which the haptic signal is transmitted. Alternatively, the haptic signal is transmitted from the touch controller to the actuator controller over a serial bus interface. In response to the received haptic signal, the actuator controller implements an appropriate drive signal in the form of a haptic waveform to the one or more haptic drive elements of the touchscreen.

46 Claims, 3 Drawing Sheets

(56) References Cited

U.S. PATENT DOCUMENTS

| | | | |
|---|---|---|---|
| 2008/0062145 A1 | 3/2008 | Shahoian et al. | |
| 2010/0156818 A1* | 6/2010 | Burrough et al. | 345/173 |
| 2010/0156823 A1 | 6/2010 | Paleczny et al. | |
| 2010/0308838 A1* | 12/2010 | Lee et al. | 324/537 |
| 2011/0128250 A1* | 6/2011 | Murphy et al. | 345/174 |
| 2011/0248930 A1* | 10/2011 | Kwok et al. | 345/173 |
| 2011/0248931 A1* | 10/2011 | Shenfield et al. | 345/173 |

OTHER PUBLICATIONS

Daniel Carrica et al., "Random Sampling Applied to the Measurement of a DC Signal Immersed in Noise", pp. 1319-1323, IEEE Transactions on Instrumentation and Measurement, vol. 50, No. 5, Oct. 2001.

Publication No. US-2011-0261005-A1, Publication Date: Oct. 27, 2011, U.S. Appl. No. 12/986,776, filed Jan. 7, 2011, Ashutosh Ravindra Joharapurkar.

Publication No. US-2011-0261006-A1, Publication Date: Oct. 27, 2011, U.S. Appl. No. 12/986,841, filed Jan. 7, 2011, Ashutosh Ravindra Joharapurkar.

Publication No. US-2011-0261007-A1, Publication Date: Oct. 27, 2011, U.S. Appl. No. 12/986,881, filed Jan. 7, 2011, Ashutosh Ravindra Joharapurkar.

Publication No. US-2011-0260990-A1, Publication Date: Oct. 27, 2011, U.S. Appl. No. 12/986,991, filed Jan. 7, 2011, Yassir Ali.

Publication No. US-2011-0261008-A1, Publication Date: Oct. 27, 2011, U.S. Appl. No. 12/987,008, filed Jan. 7, 2011, Ashutosh Ravindra Joharapurkar.

Non-Final Office Action dated Sep. 29, 2011, U.S. Appl. No. 12/315,690, filed Dec. 5, 2008, Anthony Stephen Doy.

* cited by examiner

SYSTEM INTEGRATION OF TACTILE FEEDBACK AND TOUCHSCREEN CONTROLLER FOR NEAR-ZERO LATENCY HAPTICS PLAYOUT

RELATED APPLICATIONS

The following co-owned, co-filed, and co-pending applications, U.S. patent application Ser. No. 12/986,776, titled "Method and Apparatus for Improving Dynamic Range of a Touchscreen Controller", U.S. patent application Ser. No. 12/986,841, titled "Charge Transfer Scheme to Convert Capacitance to Voltage for Touchscreen Controller," U.S. patent application Ser. No. 12/986,881, titled "Noise Cancellation Technique for Capacitive Touchscreen Controller Using Differential Sensing," and U.S. patent application Ser. No. 12/987,008, titled "Use of Random Sampling Technique to Reduce Finger-Coupled Noise," are all incorporated by reference in their entireties.

FIELD OF THE INVENTION

The present invention relates to the field of touch panels or touchscreens. More particularly, the present invention relates to the field of touch panels or touchscreens that provide haptic feedback.

BACKGROUND OF THE INVENTION

Many electrical devices are incorporating touchscreen type displays. A touchscreen is a display that detects the presence, location, and optionally pressure of a touch within the display area, generally by a finger, hand, stylus, or other pointing device. The touchscreen enables a user to interact with the display module directly without requiring any intermediate device, rather than indirectly via a mouse, touchpad or mechanical keyboard arrangement. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A resistive touchscreen panel is composed of several layers including two thin metallic electrically conductive layers separated by thin space. When some object touches the touchscreen panel, the layers are connected at certain point. In response to the object contact, the panel electrically acts similar to two voltage dividers with connected outputs. This causes a change in the electrical current that is registered as a touch event and sent to the controller for processing.

A capacitive touchscreen panel is coated, partially coated, or patterned with a material that conducts a continuous electrical current across a sensor. The sensor exhibits a precisely controlled field of stored electrons in both the horizontal and vertical axes to achieve capacitance. The human body is also an electrical device that has stored electrons and therefore also exhibits capacitance. When a reference capacitance of the sensor is altered by another capacitance field, such as a finger, electronic circuits connected to the panel measure the resultant distortion in the reference capacitance. The measured information related to the touch event is sent to the controller for mathematical processing. Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

Other types of touchscreen technologies include surface acoustic wave technology that uses ultrasonic waves, infrared touchscreen panels, strain gauge panels coupled to springs, optical imaging, dispersive signal technology, and total internal reflection.

Haptic technology refers to technology which interfaces to the user via the sense of touch by applying forces, vibrations and/or motions to the user. Either the entire device is vibrated, such as the silent mode on a cellular telephone, or only the touch surface is vibrated, such as a haptic touchscreen. Haptic, or tactile, feedback provides confirmation of a button touch or press on a touchscreen control panel, or a confirmation of an action taken.

Haptic feedback is conventionally provided by attaching one or more transducers to the touchscreen, and vibrating the entire, or parts of the, panel using the one or more transducers. In some applications, localized haptic feedback is provided where only the part of the panel actually touched vibrates by using multiple phased actuators and obtaining standing wave patterns on the panel. A transducer converts an electrical signal to mechanical energy. Piezoelectric actuators are sometimes used as the transducers. The piezoelectric actuators vibrate when excited by an electrical signal.

Figure 1:
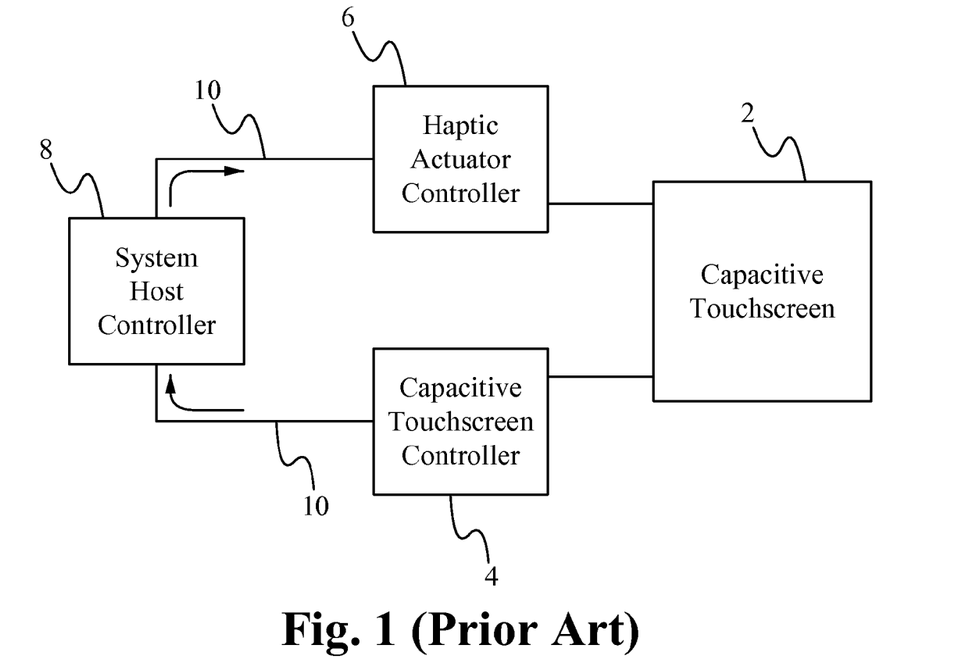
FIG. 1 illustrates a conventional haptic feedback system.

A haptic feedback system includes feedback circuitry coupled to a touch surface, such as a touchscreen, for detecting the location(s) being touched, processing the detecting touch, and providing a haptic feedback to the touch surface in response to the processing. FIG. 1 illustrates a conventional haptic feedback system including a touchscreen 2, a capacitive touchscreen controller 4, a system host controller 8, and a haptic actuator controller. The system host controller 8, the capacitive touchscreen controller 4, and the haptic actuator controller 6 are coupled via a serial bus interface 10. The touchscreen 2 is a capacitive touchscreen having one or more sensors for sensing when the touchscreen is touched. The raw sensed data is transmitted from the sensors to the capacitive touchscreen controller 4. The sensed data is converted by the touchscreen controller 4 to digital information and sent to the system host controller 8 for processing. The system host controller 8 processes the converted sensed data according to what item was selected on the touchscreen 2, as determined by the touched position on the touchscreen 2 and the information displayed on the touchscreen 2 when the touch occurred. For example, a specific application or action to be performed is selected and the system host controller 8 processes that selection. The system host controller 8 decides whether or not to issue a signal to the haptic actuator controller 6 as part of that processing, which in turn signals an actuator of the touchscreen 2. The actuator vibrates the touchscreen. The actuator is any electro-mechanical system that converts electrical energy into mechanical energy. In some applications, the touchscreen 2 can also have one or more force sensing elements for sensing pressure applied to the touchscreen. The pressure data can be used instead of or in addition to the sensed position data to generate the signal provided to the haptic actuator controller 6.

The system host controller 8 introduces latency that delays the haptic response sensed by the user. The system host controller may already be occupied performing other processing tasks, in addition to performing processing tasks associated with the item selected on the touchscreen that initiated the need for haptic response. Sense of touch is very responsive. If the touchscreen is touched, and a vibration (haptic response) is not felt within a relatively short duration, for example 30 milliseconds, the user often concludes that the original touch was not sensed by the touchscreen and another attempt is made, often by pressing harder. Such delays are annoying for the user. The latency of the conventional haptic feedback architecture ranges from a few milliseconds when the system host controller is idle and customized haptic specific software has been added to the operating system of the system host controller to 100 milliseconds or more if the system host controller is busy when the digital information is received. Standard operating systems do not support haptic feedback, such functionality is a customized addition.

SUMMARY OF THE INVENTION

A haptic feedback system includes a user interface device such as a touchscreen that includes a touch panel and one or more haptic drive elements coupled to the touch panel, a touch controller, and an actuator controller. The touch controller receives sensed data indicative of a touch event from the touch panel, and in response generates and sends a haptic trigger signal to an actuator controller. Generation and transmission of the haptic trigger signal bypasses any system host controller. In some embodiments, a dedicated signal path couples the touch controller and the actuator controller, over which the haptic trigger signal is transmitted. In other embodiments, the haptic trigger signal is transmitted from the touch controller to the actuator controller over a serial bus interface. In response to the received haptic trigger signal, the actuator controller implements an appropriate drive signal in the form of a haptic waveform to the one or more haptic drive elements of the touchscreen.

In one aspect, a touch feedback system is disclosed that includes a user touch interface comprising an interface surface and a drive element coupled to the interface surface, wherein the interface surface is configured to sense a touch event and to transmit sensed data in response to the determined touch event; a touch controller coupled to the user touch interface to receive the sensed data and to generate and output a trigger signal in response to the sensed data; a transmission path coupling the touch controller to a drive element controller; and the drive element controller coupled to the touch controller and to the interface surface, wherein the drive element controller is configured to receive the trigger signal from the touch controller via the transmission path and to output a drive signal to the drive element in response to the received trigger signal. The touch controller converts the sensed data to digital information. The touch feedback system also includes a system host controller coupled to the touch controller to receive the digital information, wherein the system host controller is configured to perform system level processing corresponding to the digital information, further wherein the system host controller does not generate and output a control signal to the drive element controller in response to the digital information. The drive element can be a haptic actuator or an audio speaker. A latency between sensing the touch event and activating the drive element is equal to or less than 30 milliseconds.

In another aspect, another haptic feedback system is disclosed. The haptic feedback system includes a user touch interface comprising an interface surface and a haptic actuator coupled to the interface surface, wherein the interface surface is configured to sense a touch event and to transmit sensed data in response to the sensed touch event; a touch controller coupled to the user touch interface to receive the sensed data and to generate and output a haptic signal in response to the sensed data; a transmission path coupling the touch controller to a haptic actuator controller; and the haptic actuator controller coupled to the touch controller and to the interface surface, wherein the haptic actuator controller is configured to receive the haptic signal from the touch controller via the transmission path and to output a haptic waveform to the haptic actuator in response to the received haptic signal. The user touch interface can be a touchscreen and the touch controller can be a touchscreen controller. The touchscreen can be a capacitive touchscreen or a resistive touchscreen. The interface surface can be a display surface, one or more push buttons, or one or more capacitive buttons. The transmission path can be a single line interconnect, a multiple line interconnect, or a serial bus interface. The transmission path can be a direct connection between the touch controller and the haptic actuator controller.

The haptic signal can be a haptic trigger signal. The haptic actuator controller can include a memory configured to store a plurality of haptic waveforms to drive the haptic actuator, further wherein the haptic trigger signal can include a haptic waveform identification used by the haptic actuator controller to select one of the stored plurality of haptic waveforms to output to the haptic actuator. The haptic feedback system can also include a haptic waveform repository coupled to the haptic actuator controller, wherein the haptic waveform repository can be configured to store a plurality of haptic waveforms to drive the haptic actuator, further wherein the haptic trigger signal can include a haptic waveform identification used by the haptic actuator controller to select one of the stored plurality of haptic waveforms to output to the haptic actuator. The haptic signal can be a low voltage haptic waveform, further wherein the haptic actuator controller can be configured to receive boost the low voltage haptic waveform to a high voltage haptic waveform sufficient to actuate the haptic actuator. The touch controller converts the sensed data to digital information. The haptic feedback system can also include a system host controller coupled to the touch controller to receive the digital information, wherein the system host controller can be configured to perform system level processing corresponding to the digital information, further wherein the system host controller does not generate and output a haptic related signal to the haptic actuator controller in response to the digital information. The sensed data can be touch coordinate data or pressure data. The haptic feedback system can also include a serial bus interface coupled to the touch controller, the haptic actuator controller, and the system host controller. The serial bus interface can be independent and separate from the transmission path, or the serial bus interface can be the transmission path, where the haptic signal is addressed to the haptic actuator controller by the touch controller. A latency between sensing the touch event and activating the haptic actuator is equal to or less than 30 milliseconds. The touch controller can be a separately packaged integrated circuit chip than the haptic actuator controller. The touch controller can be a first integrated circuit chip and the haptic actuator controller can be a second integrated circuit chip, wherein the first integrated circuit chip and the second integrated circuit chip can be integrated as a multiple-chip integrated circuit package. The haptic actuator can be configured to sense the touch event.

In yet another aspect, a method of providing haptic feedback is disclosed. The method includes sensing a touch event on an interface surface; transmitting sensed data to a touch controller in response to the sensed touch event; generating a haptic signal by the touch controller in response to the sensed data; outputting the haptic signal from the touch controller to a haptic actuator controller via a transmission path; outputting a haptic waveform by the haptic actuator controller to a haptic actuator coupled to the interface surface in response to the haptic signal; and actuating the haptic actuator according to the haptic waveform.

BRIEF DESCRIPTION OF THE DRAWINGS

The accompanying drawings, which are incorporated in and form a part of this specification, illustrate embodiments of the haptic feedback system and, together with the description, serve to explain the principles of the haptic feedback system, but not limit the invention to the disclosed examples.

DETAILED DESCRIPTION OF THE EMBODIMENTS

Embodiments of the present invention are directed to a haptic feedback system. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

While the haptic feedback system will be described in conjunction with the embodiments below, it will be understood that they are not intended to limit the methods and systems of these embodiments and examples. On the contrary, the haptic feedback system is intended to cover alternatives, modifications and equivalents, which may be included within the spirit and scope of the haptic feedback system as defined by the appended claims. Furthermore, in the following detailed description, numerous specific details are set forth in order to more fully illustrate the methods and systems. However, it will be apparent to one of ordinary skill in the prior art that the methods and systems may be practiced without these specific details.

In accordance with the present application, some of the components, process steps, and/or data structures may be implemented using various types of processing systems, including hardware, software, or any combination thereof. In addition, those of ordinary skill in the art will recognize that devices of a less general purpose nature, such as hardwired devices, application specific integrated circuits (ASICs), or the like, may also be used without departing from the scope and spirit of the inventive concepts disclosed herein.

In some embodiments, a haptic feedback system includes a control panel configured with both touch sense input functionality, such as a touchscreen, and haptic response functionality that provides tactile feedback to a user. As used herein, such a control panel is referred to as a touch panel. The touch panel can be a conductive touchscreen panel, a resistive touchscreen panel, or other conventional touch sensitive interface. The haptic response is provided by one or more drive elements, or actuators, used to vibrate or otherwise physically move the surface of the touch panel in order to provide physical confirmation of a selection event, or touch event, on the touch panel. Such haptic, or vibrational, feedback is generated by modulating the drive elements with a driving signal provided by an actuator controller. The driving signal is configured as a basic or complex waveform, such as a square wave or sine wave. Accordingly, the driving signal is also referred to as a haptic waveform. In other embodiments, the haptic feedback system is applied to a user interface device having capacitive buttons or pushbuttons, and optionally a display. The haptic feedback is used to vibrate one or more of the buttons in response to one of the buttons being pushed. Although the haptic feedback system is described below in terms of a touchscreen, it is understood that the haptic feedback system can be generally applied to other touch input, user interface devices.

The haptic feedback system includes a touch controller that receives sensed data from the touch panel, and in response generates and sends a haptic signal to the actuator controller. In some embodiments, the haptic signal is a haptic trigger signal. In other embodiments, the haptic signal is an actual haptic waveform. Generation and transmission of the haptic signal bypasses any system host controller. In some embodiments, a dedicated transmission line is included between the touch controller and the actuator controller, over which the haptic signal is transmitted. In other embodiments, the haptic signal is transmitted from the touch controller to the actuator controller over a serial bus interface. In response to the received haptic signal, the actuator controller implements an appropriate drive signal to the one or more drive elements of the touchscreen. Latency between a touch event sensed by the touchscreen and a corresponding haptic response to the user is reduced by removing involvement of the system host controller. Further, since there is not system host controller involvement in providing the haptic feedback, there are no required changes in the operating stack of the host operating system.

Figure 2:
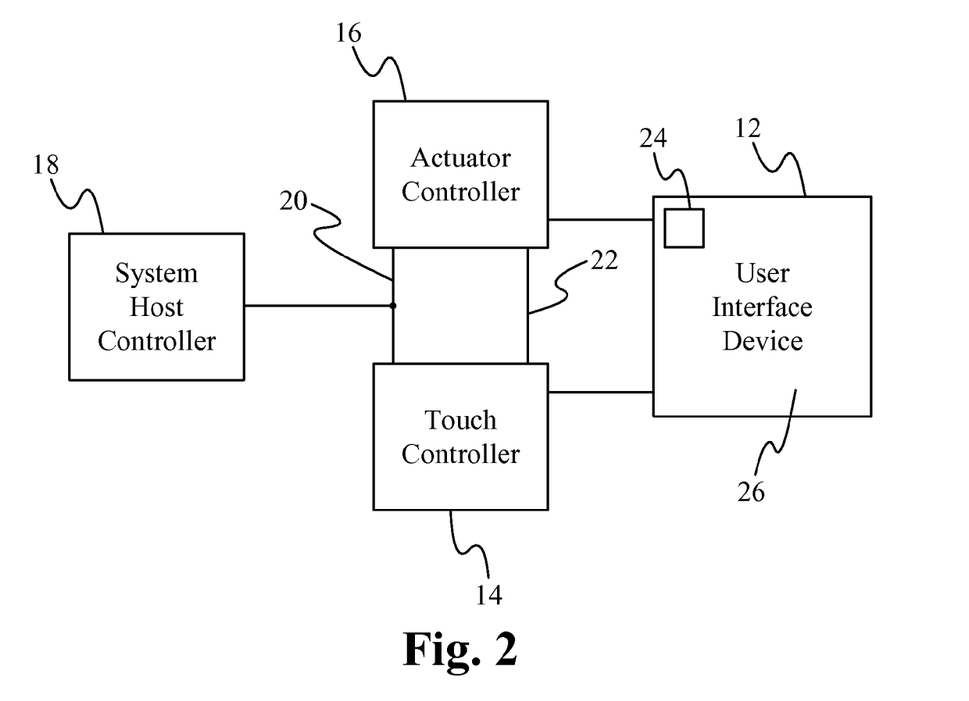
FIG. 2 illustrates a functional block diagram of a haptic feedback system according to a first embodiment of the present invention.

FIG. 2 illustrates a functional block diagram of a haptic feedback system according to a first embodiment of the present invention. The haptic feedback system includes a user interface device 12, a touch controller 14, an actuator controller 16, and a system host controller 18. In some embodiments, the touch controller 14 is a separate integrated circuit chip than the actuator controller 16. In some embodiments, the touch controller integrated circuit chip and the actuator controller integrated circuit chip are separately packaged. In other embodiments, the touch controller integrated circuit chip and the actuator controller integrated circuit chip are integrated as a multiple-chip integrated circuit package. In some embodiments, the user interface device 12 is a capacitive touchscreen panel that includes a touch panel 26 and one or more drive elements 24 coupled to the touch panel 26. In this case, the touch controller 14 functions as a touchscreen controller. The touch panel 26 is configured to sense a touch event, or multiple simultaneous touch events, signifying a user selection. A touch event is registered by either direct contact on the touch panel or proximate contact, as is well known in the art. The touch panel can be a conductive touchscreen panel, a resistive touchscreen panel, or other conventional type of panel that can be used to sense a touch event.

The user interface device 12 sends the data sensed by the touch panel 26 to the touch controller 14. The touch controller 14 converts the raw sensed data into digital information. In some embodiments, the digital information represents the number of touch events and the position of each touch event on the touch panel. Other information may also be represented, for example the touch event may be a swiping motion across multiple points on the touch panel, the direction of the swipe, and the distance of the swipe. A swipe may be representative, for example, of a scrolling motion for scrolling a currently displayed image or page, or for changing to another image or page in a series such as a slide show. In some embodiments, the user interface device 12 is configured to detect actual pressure applied to the touch panel 26. In this case, sensed data includes the detected pressure, and the digital information converted from the sensed data includes a metric proportional to the sensed pressure. In general, the digital information can include, but is not limited to, touch coordinate data and/or pressure data. It is understood that other information can be represented by the digital information as is well known in the art.

The touch controller 14 processes the digital information to determine if a haptic response is to be initiated. In some embodiments, the touch controller 14 is configured with a haptic enable/disable flag. When disabled, a haptic response is not initiated when a touch event is sensed, regardless of the nature of the digital information corresponding to the touch event. When enabled, the touch controller 14 processes the digital information and determines if a haptic response is to be generated. In some embodiments, a haptic response is determined appropriate according to what is currently displayed on the touch panel 26, the position of the touch event on the touch panel 26, the type of touch event, such as a single touch or a swipe, and/or the number of touch events, such as a single touch event or multiple touch events. In other embodiments, a haptic response is generated for any touch event regardless of the current display, touch event position, touch event type, or number of touch events. In some embodiments, each generated haptic response is of the same type, for example a single pulse vibration, regardless of the current display, touch event position, touch event type, or number of touch events. In other embodiments, different types of haptic responses can be selected based on the current display, touch event position, touch event type, and/or number of touch events. It is understood that other criteria can be used to determine if a haptic response is to be generated and the type of haptic response to be generated.

If the touch controller 14 determines that a haptic response is to be initiated, then the touch controller 14 generates a haptic trigger signal. In those configurations where the haptic feedback system is designed to provide multiple different types of haptic responses, the touch controller 14 also determines the type of haptic response to be generated, which is conveyed within the haptic trigger signal. In general, N number of different types of haptic responses can be designated. In some embodiments, 16 different types of haptic responses are available, and the touch controller 14 selects one of the available types, as indicated by a 4-bit sequence within the haptic trigger signal. In some embodiments, the each type of haptic response represents a specific haptic waveform or combination of specific haptic waveforms, and the haptic trigger signal includes a waveform identification (ID) representative of one, or a combination, of the haptic waveforms. The touch controller 14 sends the haptic trigger signal to the actuator controller 16. In the case where only a single haptic response is used for all haptic responses, the haptic trigger signal may only include a single bit enable/disable for either initiating or not initiating a haptic response. In some embodiments, the single bit enable/disable is also considered a waveform ID in the sense that enabling the haptic response results in a standard haptic waveform being used.

In some applications, the touch controller 14 functions as an intelligent system. For example, the touch controller 14 determines touch events in N different regions of the touch panel 26, and in response to a touch event occurring in a specific region, the intelligence determines a corresponding waveform ID that is sent within the haptic trigger signal. Based on the sensed region, the touch controller 14 sends a unique haptic trigger signal to the actuator controller 16. In other applications, the touch controller 14 functions as a simple system, where it is not determined where the touch event occurs on the touch panel 26, and in response to a touch event, a simple haptic trigger signal is sent to the actuator controller. In response to the simple haptic trigger signal, a default haptic waveform is used. For example, when using a displayed keyboard to type a text message, to indicate when each text character is selected, only a simple, default haptic waveform or pulse is needed to vibrate the entire touch panel 26. In this simplified case, the haptic trigger signal is the same signal regardless of where on the touch panel 26 the touch is sensed.

As shown in FIG. 2, the touch controller 14, the actuator controller 16, and the system host controller 18 are coupled via a serial bus interface 20. Additionally, the touch controller 14 is coupled to the actuator controller 16 via interface 22. In some embodiments, the interface 22 is a single wire interface. In other embodiments, the interface 22 is a multiple wire interface. Any sensed input detected by the touch panel 26 is passed to the touch controller 14 as raw data, which is converted from a sensed signal to digital information. This digital information is processed by the touch controller 14 to generate the haptic trigger signal. The touch controller 14 also sends the digital information, or a processed version of the digital information, to the system host controller 18 for application processing, for example the processing associated with the selection of a specific application icon on the touch panel 26. The touch controller 14 is not configured to perform applications processing associated with applications displayed and selected on the touch panel 26. The system host controller 18 does not process the digital information for a haptic response. The haptic feedback system bypasses the system host controller 18 in regard to a haptic response. Instead, the touch controller 14 is configured to perform processing related to a haptic response and to signal the actuator controller 16 directly. Conceptually, the touch controller 14 and the actuator controller 16 form an independent system from the system host controller 18 for providing haptic functionality.

Figure 3:
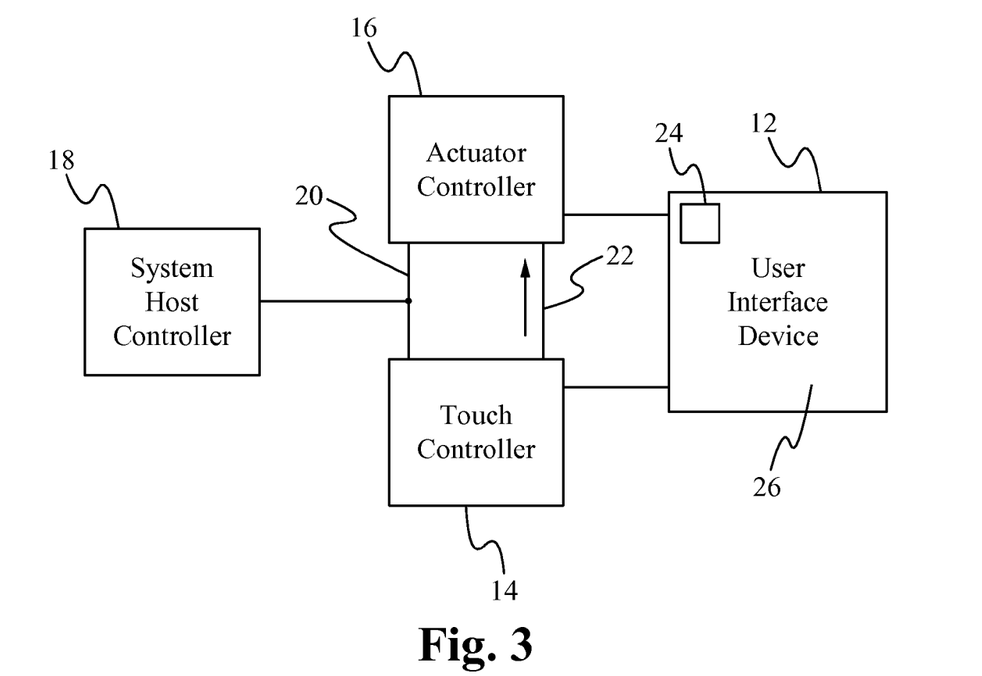
FIG. 3 illustrates the haptic feedback system of FIG. 2 where the haptic trigger signal is transmitted from the touch controller to the actuator controller via a dedicated signal path.

In some embodiments, the haptic trigger signal is transmitted from the touch controller 14 to the actuator controller 14 via a dedicated signal path, such as the interface 22 as shown in FIG. 3. In some embodiments, there is a dedicated input/output (I/O) pin on the touch controller 14 and the actuator controller 16 whose only purpose is to send and receive the haptic trigger signal. The interface 22 is coupled to the dedicated I/O pin on the touch controller 14 and the actuator controller 16.

Figure 4:
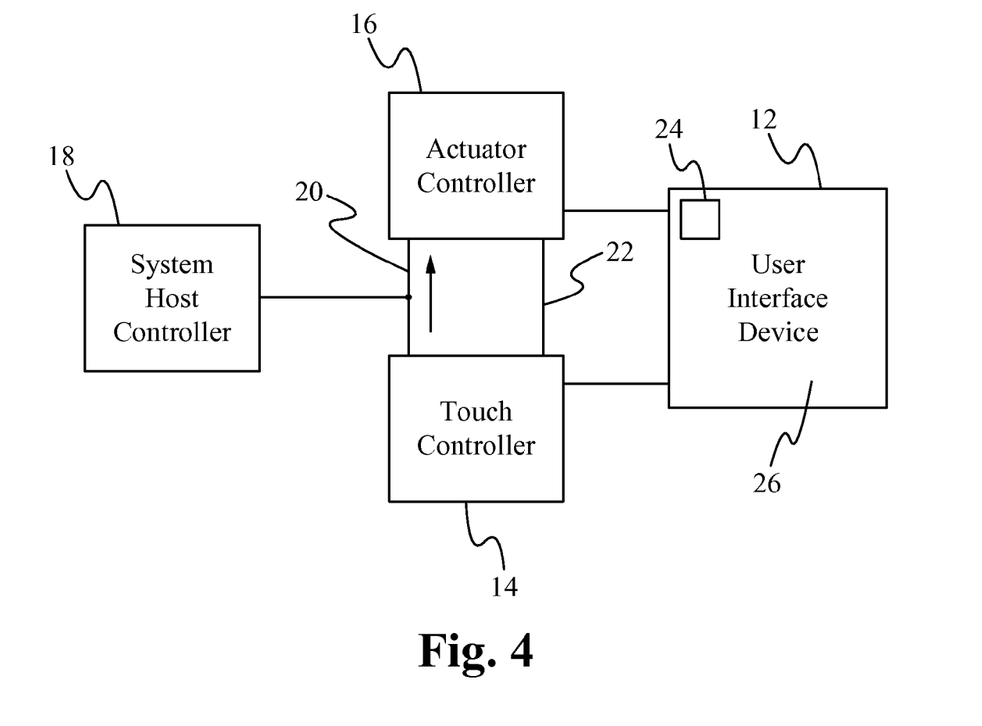
FIG. 4 illustrates the haptic feedback system of FIG. 2 where the haptic trigger signal is transmitted from the touch controller to the actuator controller via a non-dedicated signal path.
Figure 5:
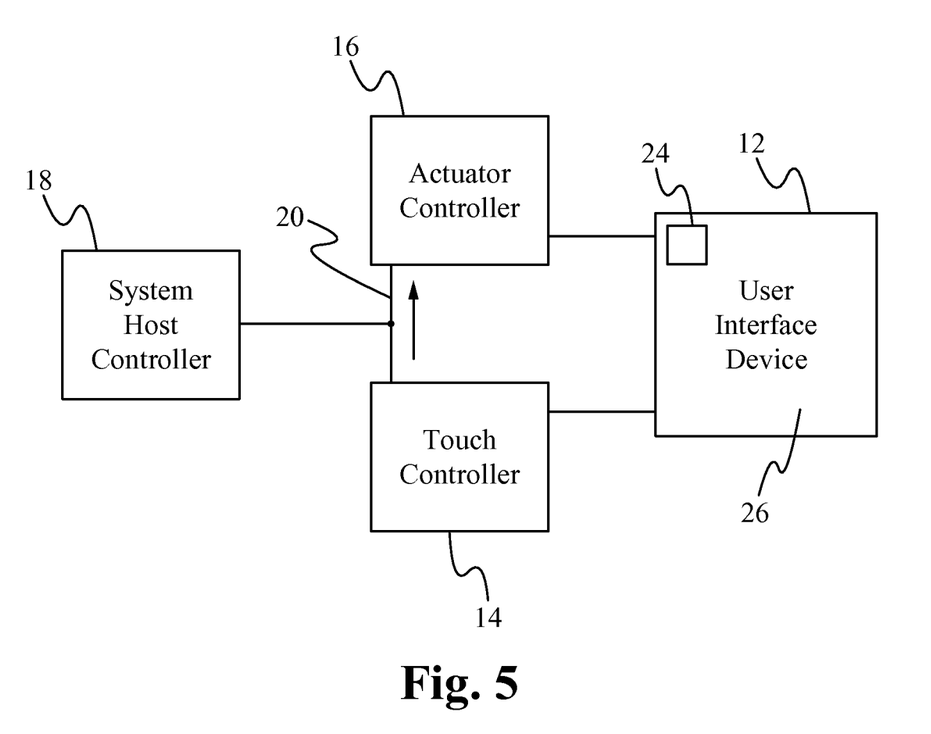
FIG. 5 illustrates a functional block diagram of a haptic feedback system according to a second embodiment of the present invention.

In some embodiments, the serial bus interface 20 functions as an alternative signaling path for the haptic trigger signal, as shown in FIG. 4, thereby adding redundancy to the haptic feedback system. In other embodiments, the haptic feedback system is configured without a dedicated signal path between the touch controller 14 and the actuator controller 16, and instead an existing non-dedicated signal path, such as the serial bus interface 20, is used to send the haptic trigger signal from the touch controller 14 to the actuator controller 16, as shown in FIG. 5. In this alternative configuration, the system host controller 18 is still bypassed when generating and sending the haptic trigger signal.

Referring again to FIG. 2, the actuator controller 16 processes the haptic trigger signal received from the touch controller 14. The waveform ID is identified from within the haptic trigger signal and the corresponding haptic waveform is selected by the actuator controller 16. The actuator controller 16 sends the selected haptic waveform to the drive element 24. In some embodiments, the haptic waveforms to be selected are stored locally within the actuator controller 16, such as within a local memory or RAM. In other embodiments, the haptic waveforms are stored off-chip from the actuator controller 16 and in response to a selection signal sent from the actuator controller 16, the selected haptic waveform is sent from the off-chip location to the drive element 24, either via the actuator controller 16 or bypassing the actuator controller 16. In some embodiments, the haptic waveforms are generated in real-time, either within the actuator controller 16 or externally to the actuator controller 16. Sometimes an actuator controller is embedded within another IC, such as a power management IC, or more generally a multi-function IC, one block of which controls the actuators.

The one or more drive elements 24 are coupled to the touch panel 26. Each drive element is a transducer that converts electrical signals to mechanical movement. In some embodiments, each drive element is a ceramic drive element or a piezoelectric drive element. In other embodiments, each drive element is a moving coil and magnet. It is understood that alternative conventional transducers can be used that convert electrical signals to mechanical movement. A haptic waveform is received as a driving signal for the one or more drive elements 24, which in turn vibrate at a frequency and amplitude determined by the haptic waveform. Movement of one or more drive elements 24 causes a corresponding movement, or vibration, of the touch panel 26.

As previously indicated, the user interface device 12 can be configured to sense actual pressure applied to the touch panel 26. In some embodiments, the one or more drive elements 24 can be configured to measure the pressure applied to the touch panel 26 by operating in the reverse direction. For example, when a piezoelectric transducer is pressed, the mechanical strain causes charge redistribution in the material of the device that can be sensed as a terminal voltage. With appropriate signal conditioning, this voltage can be used as a haptic trigger signal for the transducer excitation. In general, any transducer sensitive to movement or force can be used in this way including, but not limited to, electromechanical vibration transducers. In other embodiments, conventional pressure sensing elements are attached to the touch panel 26 to measure the applied pressure. In some embodiments, the measured pressure data is transmitted from the user interface device 12 to the actuator controller 14. The actuator controller 14 converts the received pressure data to a proportional digital code, which is output to the system host controller 18 and to the touch controller 14 via the serial bus interface 20. In this respect, the measured pressure data is also considered sensed data that is received by the touch controller 14, and that can be used to influence the generation of the haptic signal. In other embodiments, the measured pressure data is transmitted directly to the touch controller 14.

The haptic feedback system has been described above in terms of the haptic signal being the haptic trigger signal. In other embodiments, the haptic signal generated by the touch controller 14 and transmitted to the actuator controller 16 is an actual haptic waveform, instead of the haptic trigger signal. In this case, the haptic signal is a low voltage haptic waveform, selected similarly as the selection of the haptic waveform previously described, except that the selection functionality if performed by the touch controller 14, not the actuator controller 16. The actuator controller 16 boosts the received low voltage haptic waveform to a corresponding high voltage haptic waveform having a large enough voltage level required by the one or more drive elements 24.

In some embodiments, the system host controller 18 pre-enables the touch controller 14 to send haptic trigger signals to the actuator controller 16. This enablement can be changed by the system host controller 18, for example in response to a user selecting a haptic response disabled feature on the touch panel 26. When this haptic response disable feature is first selected, a haptic response is felt because the haptic feature is already enabled. Subsequent to selecting the disable haptic feature, the system host controller 18 processes this request, thereby disabling the touch controller 14 from sending haptic trigger signals. In other words, the touch controller 14 includes a register or flag for enabling/disabling the generation of haptic trigger signals. This register/flag is under the control of the system host controller 18.

Providing the haptic trigger signal from the touch controller to the actuator controller results in a consistently timed haptic feedback, as opposed to an inconsistent feedback when the system host controller is left to provide the haptic trigger signal. The inconsistent feedback is due to the inconsistent state of the system host controller, being already active in some instances, inactive in others. The latency of a conventional haptic feedback architecture, such as the system of FIG. 1, ranges from a few milliseconds when the system host controller is idle and customized haptic specific software has been added to the operating system of the host controller to 100 milliseconds or more if the system host controller is busy when the haptic trigger signal is received. In contrast, the haptic feedback system of the present invention provides a consistently timed haptic response since the touch controller 14 performs the haptic response processing, and the haptic trigger signal is sent from the touch controller 14 to the actuator controller 16. The latency of the haptic feedback system is less than 30 milliseconds, the typical sensitivity for human touch. In an exemplary application, the latency of the haptic feedback system is less than 10 milliseconds.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A touch feedback system comprising:
a user touch interface comprising an interface surface and a drive element coupled to the interface surface, wherein the interface surface is configured to sense a touch event and to transmit sensed data in response to the determined touch event;
a touch controller coupled to the user touch interface to receive the sensed data and to generate and output a trigger signal in response to the sensed data, the trigger signal including a bit sequence corresponding to a haptic response;
a transmission path directly coupling the touch controller to a drive element controller; and
the drive element controller coupled to the touch controller and to the interface surface, wherein the drive element controller is configured to receive the trigger signal from the touch controller via the transmission path and to select a drive signal based upon the bit sequence and to output a drive signal to the drive element in response to the received trigger signal,
wherein the touch controller includes a register or flag for enabling/disabling the generation of the trigger signal;
a system host controller coupled to the touch controller to control the register or flag, wherein the system host controller does not generate and output a control signal to the drive element controller.

2. The touch feedback system of claim 1 wherein the touch controller converts the sensed data to digital information.

3. The touch feedback system of claim 2 wherein the system host controller is configured to receive the digital information and to perform system level processing corresponding to the digital information.

4. The touch feedback system of claim 1 wherein the drive element comprises a haptic actuator or an audio speaker.

5. The touch feedback system of claim 1 wherein a latency between sensing the touch event and activating the drive element is equal to or less than 30 milliseconds.

6. A haptic feedback system comprising:
a user touch interface comprising an interface surface and a haptic actuator coupled to the interface surface, wherein the interface surface is configured to sense a touch event and to transmit sensed data in response to the sensed touch event;
a touch controller coupled to the user touch interface to receive the sensed data and to generate and output a haptic signal in response to the sensed data, the haptic signal including a bit sequence corresponding to a haptic response;
a transmission path coupling the touch controller to a haptic actuator controller; and
the haptic actuator controller coupled to the touch controller and to the interface surface, wherein the haptic actuator controller is configured to receive the haptic signal from the touch controller via the transmission path and to select a haptic waveform based upon the bit sequence and to output the selected haptic waveform to the haptic actuator in response to the received haptic signal,
wherein the touch controller includes a register or flag for enabling/disabling the generation of the haptic signal;
a system host controller coupled to the touch controller to control the register or flag,
wherein the system host controller does not generate and output a haptic related signal to the haptic actuator controller.

7. The haptic feedback system of claim 6 wherein the user touch interface comprises a touchscreen and the touch controller comprises a touchscreen controller.

8. The haptic feedback system of claim 7 wherein the touchscreen comprises a capacitive touchscreen.

9. The haptic feedback system of claim 7 wherein the touchscreen comprises a resistive touchscreen.

10. The haptic feedback system of claim 6 wherein the interface surface comprises a display surface.

11. The haptic feedback system of claim 6 wherein the interface surface comprises one or more push buttons.

12. The haptic feedback system of claim 6 wherein the interface surface comprises one or more capacitive buttons.

13. The haptic feedback system of claim 6 wherein the transmission path comprises a single line interconnect.

14. The haptic feedback system of claim 6 wherein the transmission path comprises a multiple line interconnect.

15. The haptic feedback system of claim 6 wherein the transmission path comprises a serial bus interface.

16. The haptic feedback system of claim 6 wherein the transmission path comprises a direct connection between the touch controller and the haptic actuator controller.

17. The haptic feedback system of claim 6 wherein the haptic signal comprises a haptic trigger signal.

18. The haptic feedback system of claim 17 wherein the haptic actuator controller comprises a memory configured to store a plurality of haptic waveforms to drive the haptic actuator, the haptic actuator controller configured to select one of the stored plurality of haptic waveforms to output to the haptic actuator based upon the bit sequence.

19. The haptic feedback system of claim 17 further comprising a haptic waveform repository coupled to the haptic actuator controller, wherein the haptic waveform repository is configured to store a plurality of haptic waveforms to drive the haptic actuator, the haptic trigger signal including the bit sequence used by the haptic actuator controller to select one of the stored plurality of haptic waveforms to output to the haptic actuator.

20. The haptic feedback system of claim 6 wherein the haptic signal comprises a low voltage haptic waveform, further wherein the haptic actuator controller is configured to receive boost the low voltage haptic waveform to a high voltage haptic waveform sufficient to actuate the haptic actuator.

21. The haptic feedback system of claim 6 wherein the touch controller converts the sensed data to digital information.

22. The haptic feedback system of claim 21 wherein the system host controller is configured to receive the digital information and to perform system level processing corresponding to the digital information.

23. The haptic feedback system of claim 22 further comprising a serial bus interface coupled to the touch controller, the haptic actuator controller, and the system host controller.

24. The haptic feedback system of claim 23 wherein the serial bus interface is independent and separate from the transmission path.

25. The haptic feedback system of claim 23 wherein the serial bus interface comprises the transmission path, further wherein the haptic signal is addressed to the haptic actuator controller by the touch controller.

26. The haptic feedback system of claim 21 wherein the sensed data comprises touch coordinate data.

27. The haptic feedback system of claim 21 wherein the sensed data comprises pressure data.

28. The haptic feedback system of claim 6 wherein a latency between sensing the touch event and activating the haptic actuator is equal to or less than 30 milliseconds.

29. The haptic feedback system of claim 6 wherein the touch controller is a separately packaged integrated circuit chip than the haptic actuator controller.

30. The haptic feedback system of claim 6 wherein the touch controller comprises a first integrated circuit chip and the haptic actuator controller comprises a second integrated circuit chip, wherein the first integrated circuit chip and the second integrated circuit chip are integrated as a multiple-chip integrated circuit package.

31. The haptic feedback system of claim 6 wherein the haptic actuator is configured to sense the touch event.

32. A method of providing haptic feedback comprising:
sensing a touch event on an interface surface;
transmitting sensed data to a touch controller in response to the sensed touch event;
generating a haptic signal by the touch controller in response to the sensed data,
the haptic signal including a bit sequence corresponding to a haptic response;
outputting the haptic signal from the touch controller to a haptic actuator controller via a transmission path;
selecting a haptic waveform from a plurality of haptic waveform by the haptic actuator controller based upon the bit sequence, each haptic waveform of the plurality of haptic waveforms corresponding to a distinct haptic response;
outputting the selected haptic waveform by the haptic actuator controller to a haptic actuator coupled to the interface surface in response to the haptic signal; and
actuating the haptic actuator according to the selected haptic waveform,
wherein the touch controller includes a register or flag for enabling/disabling the generation of the haptic signal;
controlling the register or flag by a system host controller coupled to the touch controller,
wherein the system host controller does not generate and output a haptic related signal to the haptic actuator controller.

33. The method of claim 32 wherein the transmission path comprises a single line interconnect and the method further comprises transmitting the haptic trigger signal over the single line interconnect.

34. The method of claim 32 wherein the transmission path comprises a multiple line interconnect and the method further comprises transmitting the haptic trigger signal over the multiple line interconnect.

35. The method of claim 32 wherein the transmission path comprises a serial bus interface and the method further comprises transmitting the haptic trigger signal over the serial bus interface.

36. The method of claim 35 wherein generating the haptic signal comprises addressing the haptic signal with an address of the haptic actuator controller.

37. The method of claim 32 wherein the haptic signal comprises a haptic trigger signal.

38. The method of claim 37 further comprising receiving the haptic trigger signal by the haptic actuator controller and selecting a haptic waveform in response to the received haptic trigger signal.

39. The method of claim 38 further comprising storing a plurality of haptic waveforms.

40. The method of claim 32 wherein the haptic signal comprises a low voltage haptic waveform, further wherein the haptic actuator controller is configured to receive boost the low voltage haptic waveform to a high voltage haptic waveform sufficient to actuate the haptic actuator.

41. The method of claim 32 further comprising converting the sensed data to digital information by the touch controller.

42. The method of claim 41 wherein the system host controller performs system level processing corresponding to the digital information transmitted from the touch controller.

43. The method of claim 32 wherein a latency between sensing the touch event and activating the haptic actuator is equal to or less than 30 milliseconds.

44. The method of claim 32 wherein the sensed data comprises touch coordinate data.

45. The method of claim 32 wherein the sensed data comprises pressure data.

46. The method of claim 45 wherein transmitting sensed data to the touch controller comprises transmitting pressure data sensed on the interface surface to the haptic actuator controller and from the haptic actuator controller to the touch controller.

* * * * *